United States Patent
Sha et al.

(10) Patent No.: US 10,592,635 B2
(45) Date of Patent: Mar. 17, 2020

(54) GENERATING SYNTHETIC LAYOUT PATTERNS BY FEEDFORWARD NEURAL NETWORK BASED VARIATIONAL AUTOENCODERS

(71) Applicant: INTERNATIONAL BUSINESS MACHINES CORPORATION, Armonk, NY (US)

(72) Inventors: Jing Sha, White Plains, NY (US); Michael A. Guillorn, Cold Springs, NY (US); Derren N. Dunn, Sandy Hook, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 15/994,461

(22) Filed: May 31, 2018

(65) Prior Publication Data

US 2019/0370435 A1    Dec. 5, 2019

(51) Int. Cl.
*G06F 17/50* (2006.01)
*G06N 3/04* (2006.01)
*G06N 5/04* (2006.01)
*G06N 3/08* (2006.01)

(52) U.S. Cl.
CPC .......... *G06F 17/5081* (2013.01); *G06N 3/04* (2013.01); *G06N 3/088* (2013.01); *G06N 5/046* (2013.01)

(58) Field of Classification Search
CPC .................................................. G06F 17/5081
USPC ........................................................ 716/110
See application file for complete search history.

(56) References Cited

U.S. PATENT DOCUMENTS

| 8,631,361 | B2 | 1/2014 | Feng |
| 9,530,200 | B2 | 12/2016 | Hsueh et al. |
| 2013/0159948 | A1* | 6/2013 | Agarwal ............. G06F 17/5081 716/112 |

(Continued)

FOREIGN PATENT DOCUMENTS

WO    WO2017178276    10/2017

OTHER PUBLICATIONS

Hamouda et al., "Enhanced OPC Recipe Coverage and Early Hotspot Detection Through Automated Layout Generation and Analysis", Proc. of SPIE, Mar. 2017, pp. 101470R-1-9, vol. 10147.

(Continued)

*Primary Examiner* — Suchin Parihar
(74) *Attorney, Agent, or Firm* — Tutunjian & Bitetto, P.C.; Vazken Alexanian

(57) ABSTRACT

A computer-implemented method, computer program product, and computer processing system are provided for generating synthetic layout patterns. The method includes receiving, by a processor, a set of physical design layouts that include a variety of layout patterns for neural network training. The method further includes generating, by the processor, a set of training layout pattern images for the neural network training by performing automatic image capturing on the set of physical design layouts with scripts. The method also includes training, by the processor, a feedforward neural network (FFNN)-based Variational Autoencoder (VAE) with the set of training layout pattern images. The method additionally includes generating, by the processor using the FFNN-based VAE, new synthetic layout images.

20 Claims, 13 Drawing Sheets

(56) References Cited

U.S. PATENT DOCUMENTS

| | | |
|---|---|---|
| 2017/0004397 A1 | 1/2017 | Yumer et al. |
| 2017/0351952 A1 | 12/2017 | Zhang et al. |
| 2017/0357896 A1 | 12/2017 | Tsatsin et al. |
| 2018/0275523 A1* | 9/2018 | Biafore .............. G01N 21/8806 |
| 2018/0285510 A1* | 10/2018 | Lutich ...................... G03F 1/36 |
| 2018/0293205 A1* | 10/2018 | Koker ................ G06F 15/8007 |
| 2018/0300434 A1* | 10/2018 | Hu ........................ G06F 17/504 |
| 2019/0147134 A1* | 5/2019 | Wang ................ G06F 17/5081 |
| 2019/0204755 A1* | 7/2019 | Kicken .............. G03F 7/70283 |

OTHER PUBLICATIONS

Jeon et al., "Early Stage Hot spot Analysis through Standard cell base random pattern generation", Proc. of SPIE, Apr. 2017, pp. 101480S-1-7, vol. 10148.

Neogi et al., "Design Space Analysis of Novel Interconnect Constructs for 22NM FDXTM Technology", Proc. of SPIE, Mar. 2017, pp. 101480Z-1-7, vol. 10148.

Yu et al., "Machine Learning and Pattern Matching in Physical Design", IEEE 2015, Jan. 2015, pp. 286-293.

\* cited by examiner

GENERATING SYNTHETIC LAYOUT PATTERNS BY FEEDFORWARD NEURAL NETWORK BASED VARIATIONAL AUTOENCODERS

BACKGROUND

Technical Field

The present invention generally relates to semiconductors, and more particularly to generating synthetic layout patterns by Feedforward Neural Network (FFNN) based variational autoencoders.

Description of the Related Art

In semiconductor design and manufacturing, generating synthetic layout patterns is crucial for manufacturability study, early stage hot spot analysis, and failure mode analysis, especially when real layout/data is limited.

SUMMARY

According to an aspect of the present invention, a computer-implemented method for generating synthetic layout patterns. The method includes receiving, by a processor, a set of physical design layouts that include a variety of layout patterns for neural network training. The method further includes generating, by the processor, a set of training layout pattern images for the neural network training by performing automatic image capturing on the set of physical design layouts with scripts. The method also includes training, by the processor, a feedforward neural network (FFNN)-based Variational Autoencoder (VAE) with the set of training layout pattern images. The method additionally includes generating, by the processor using the FFNN-based VAE, new synthetic layout images.

According to another aspect of the present invention, a computer program product is provided for generating synthetic layout patterns. The computer program product includes a non-transitory computer readable storage medium having program instructions embodied therewith. The program instructions are executable by a computer to cause the computer to perform a method. The method includes receiving, by a processor, a set of physical design layouts that include a variety of layout patterns for neural network training. The method further includes generating, by the processor, a set of training layout pattern images for the neural network training by performing automatic image capturing on the set of physical design layouts with scripts. The method also includes training, by the processor, a feedforward neural network (FFNN)-based Variational Autoencoder (VAE) with the set of training layout pattern images. The method additionally includes generating, by the processor using the FFNN-based VAE, new synthetic layout images.

According to yet another aspect of the present invention, a computer processing system is provided for generating synthetic layout patterns. The system includes a memory for storing program code. The system further includes a processor, operatively coupled to the memory, for running program code to receive a set of physical design layouts that include a variety of layout patterns for neural network training. The processor further runs program code to generate a set of training layout pattern images for the neural network training by performing automatic image capturing on the set of physical design layouts with scripts. The processor also runs program code to train a feedforward neural network (FFNN)-based Variational Autoencoder (VAE) with the set of training layout pattern images. The processor additionally runs program code to generate, using the FFNN-based VAE, new synthetic layout images.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to generating synthetic layout patterns by Feedforward Neural Network based Variational Autoencoders (VAEs).

In an embodiment, the present invention builds an image-based variational auto-encoder with an architecture of fully connected neural networks or convolutional neural networks to automatically generate, in any scale, synthetic layout patterns that look like real layout patterns.

In an embodiment, the present invention can generate realistic layout patterns, such that VAE models are configured to produce synthetic data that looks like real data.

In an embodiment, the present invention enables automation, such that human intervention is not required for inference (generating synthetic layout patterns by trained VAE models) after model training.

In an embodiment, the present invention enables scalability, such that the trained model(s) can generate new layout patterns instantly.

In an embodiment, the present invention enables cumulative learning, such that the model(s) becomes more versatile with more real training data (layout patterns).

In an embodiment, the present invention enables usability, such that the present invention is suitable for both EDA companies and foundries.

Figure 1:
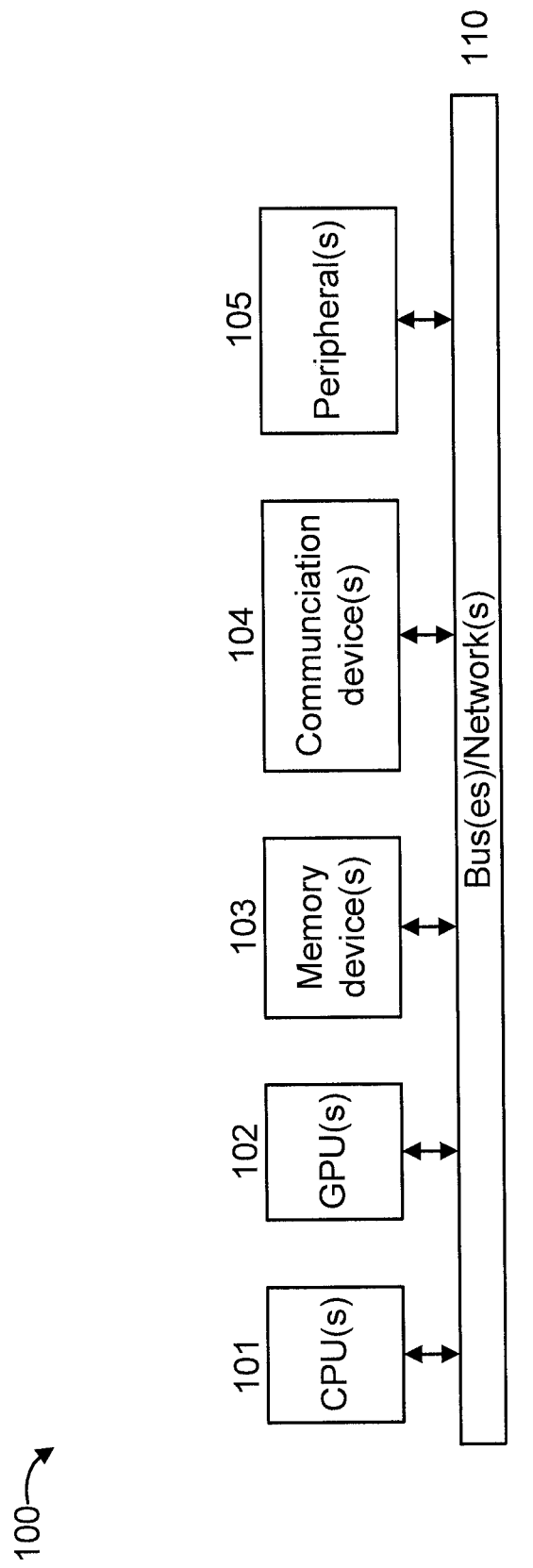
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, and so forth. Elements of processing system 100 are connected by one or more buses or networks (collectively denoted by the figure reference numeral 110).

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. Further, in another embodiment, a cloud configuration can be used (e.g., see FIGS. 12-13). These and other variations of the processing system 100 are readily contemplated by one of ordinary skill in the art given the teachings of the present invention provided herein.

Part or all of processing system 100 may be implemented in one or more of the elements of the VAEs and/or architectures and/or workflows described herein. Similarly, part or all of processing system 100 may be implemented in one or more of the elements of the cloud computing environment 1200 of FIG. 12.

Embodiments of the present invention involve the use of Variational Autoencoders (VAEs), which are a type of autoencoder. An autoencoder is a type of unsupervised artificial neural network that learns to copy its inputs to its outputs.

An autoencoder is always composed of two parts, namely an encoder (a.k.a. "a recognition network", hereinafter "encoder") and a decoder (a.k.a. "a generative network", hereinafter "decoder"). The encoder converts the inputs to an internal representation (a.k.a. "codings"). The decoder converts the internal representation (the codings) to outputs that closely match the inputs. The codings typically have a much lower dimensionality than the input data, which makes an autoencoder useful for dimensionality reduction.

VAEs are probabilistic in that their outputs are partially determined by chance, even after training. VAEs are also generative in that they generate new instances that look like they were sampled from the training set. In a VAE architecture, the encoder produces mean codings $\mu$ and standard deviation codings $\sigma$, rather than deterministic codings. The actual codings are then sampled randomly from a Gaussian distribution with mean $\mu$ and standard deviation $\sigma$. The decoder takes the actual codings and decodes them normally to match outputs to inputs.

Figure 2:
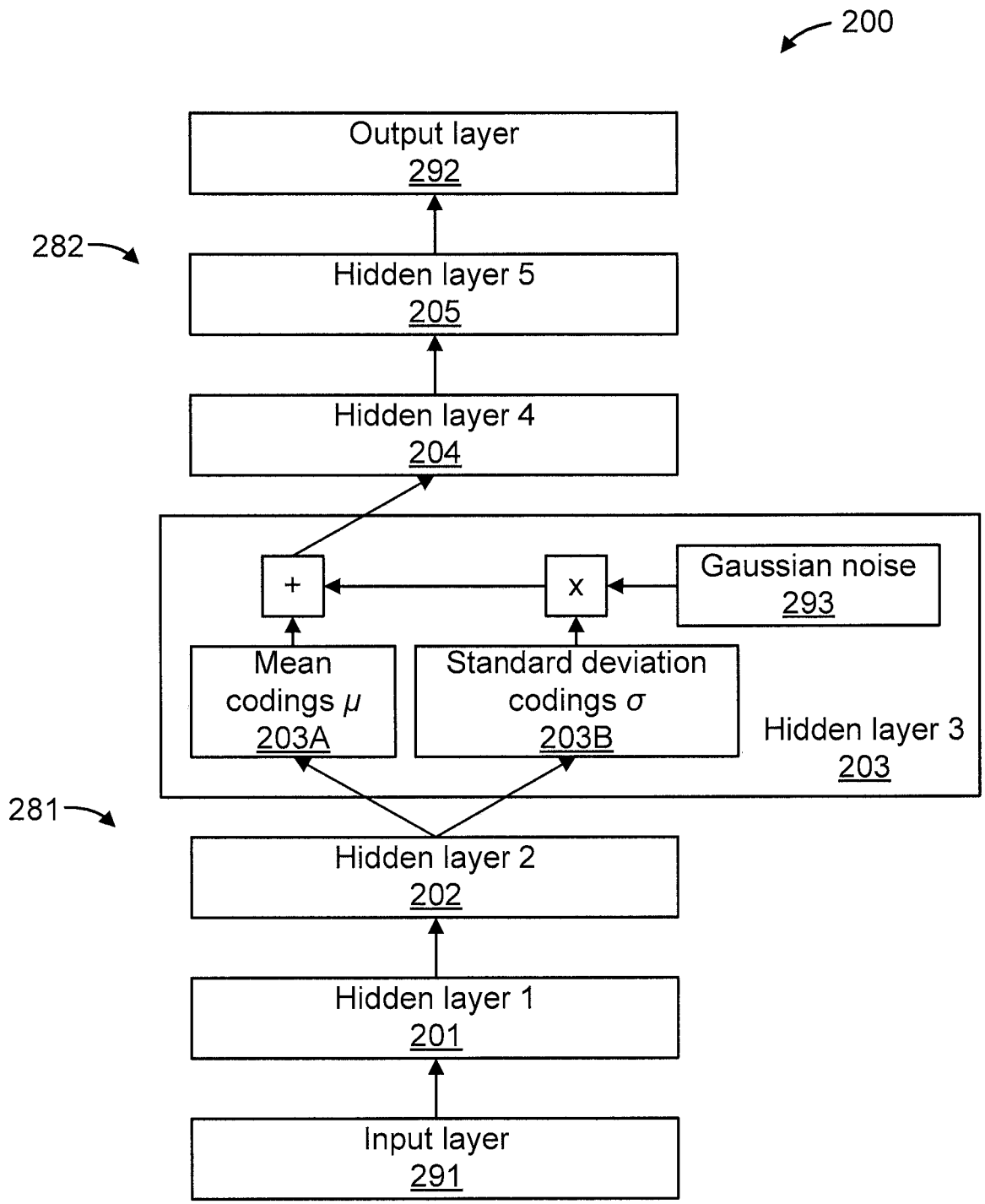
FIG. 2 is a block diagram showing an exemplary Variational Autoencoder (VAE) to which the present invention can be applied, in accordance with an embodiment of the present invention.

FIG. 2 is a block diagram showing an exemplary Variational Autoencoder (VAE) 200 to which the present invention can be applied, in accordance with an embodiment of the present invention.

The VAE 200 includes an input layer 291, a hidden layer 1 201, a hidden layer 2 202, a hidden layer 3 203, a hidden layer 4 204, a hidden layer 5 205, and an output layer 292. In VAE 200, the hidden layer 1 201 and hidden layer 2 202 can be considered to form an encoder part 281 of VAE 200, while hidden layer 4 204 and hidden layer 5 205 can be considered to form a decoder part 282 of VAE 200. The layers perform dimensional reduction (encoder) or dimensional expansion (decoder) using various activation functions applied to the inputs thereof.

The input layer 291 receives inputs of the VAE 200 that are then provided to the next layer, i.e., hidden layer 1 201. Hidden layer 1 201 processes the input to provide a dimensionally reduced representation that is then, in turn, provided to hidden layer 2 202 for similar processing.

The hidden layer 3 203 samples mean codings $\mu$ 203A and the standard deviation codings $\sigma$ 203B. The codings are sampled by multiplying the standard deviation codings $\sigma$ 203B by a Gaussian noise distribution 293 to obtain a product that is then added to the mean codings $\mu$ 203A. The codings are decoded, by hidden layer 4 204 and hidden layer 5 205, in order to match the outputs to the inputs. The output layer 292 provides the outputs of the VAE 200.

Figure 3:
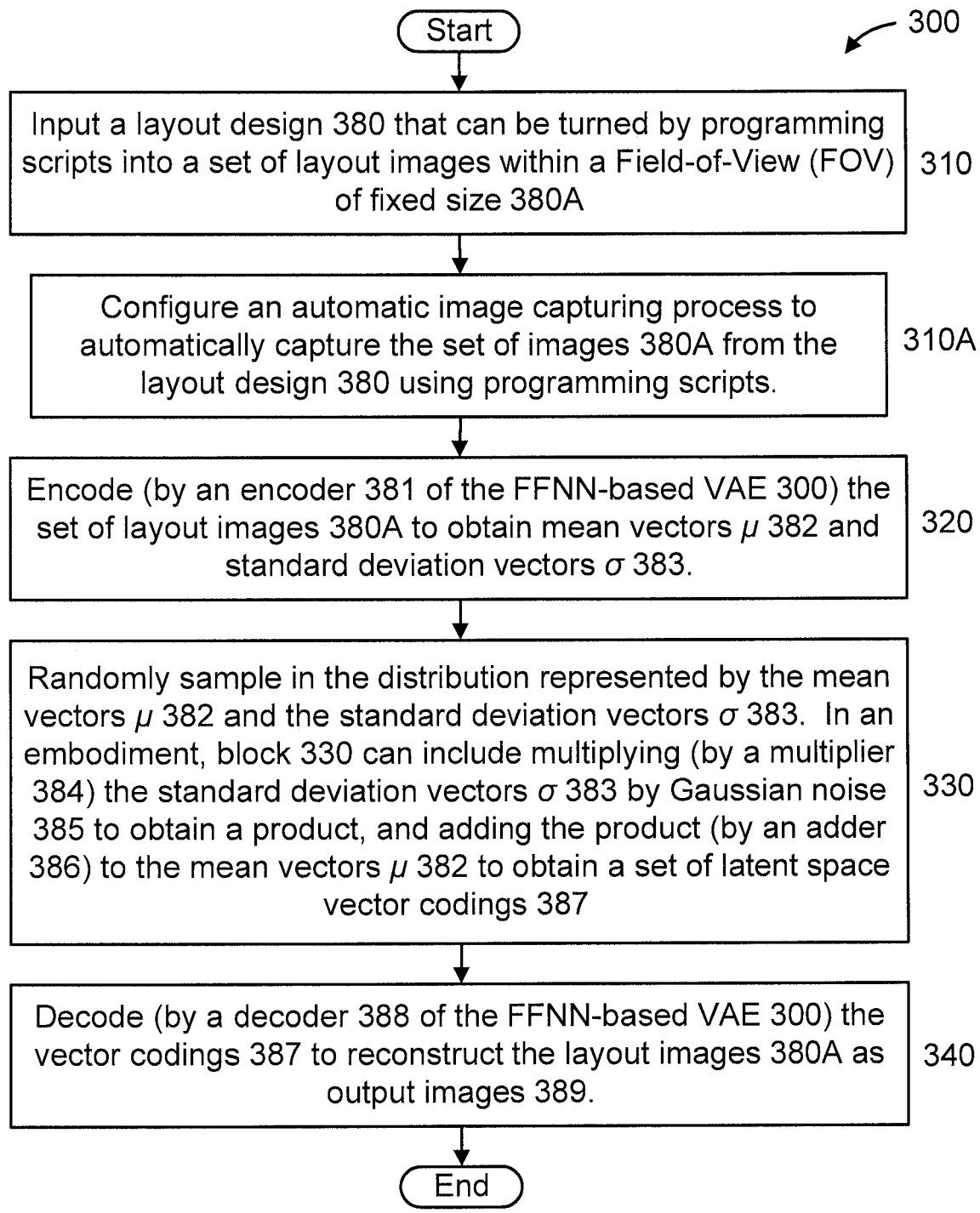
FIG. 3 is a flow diagram showing an exemplary training workflow for training a Feedforward Neural Network (FFNN)-based Variational Autoencoder (VAE), in accordance with an embodiment of the present invention.
Figure 4:
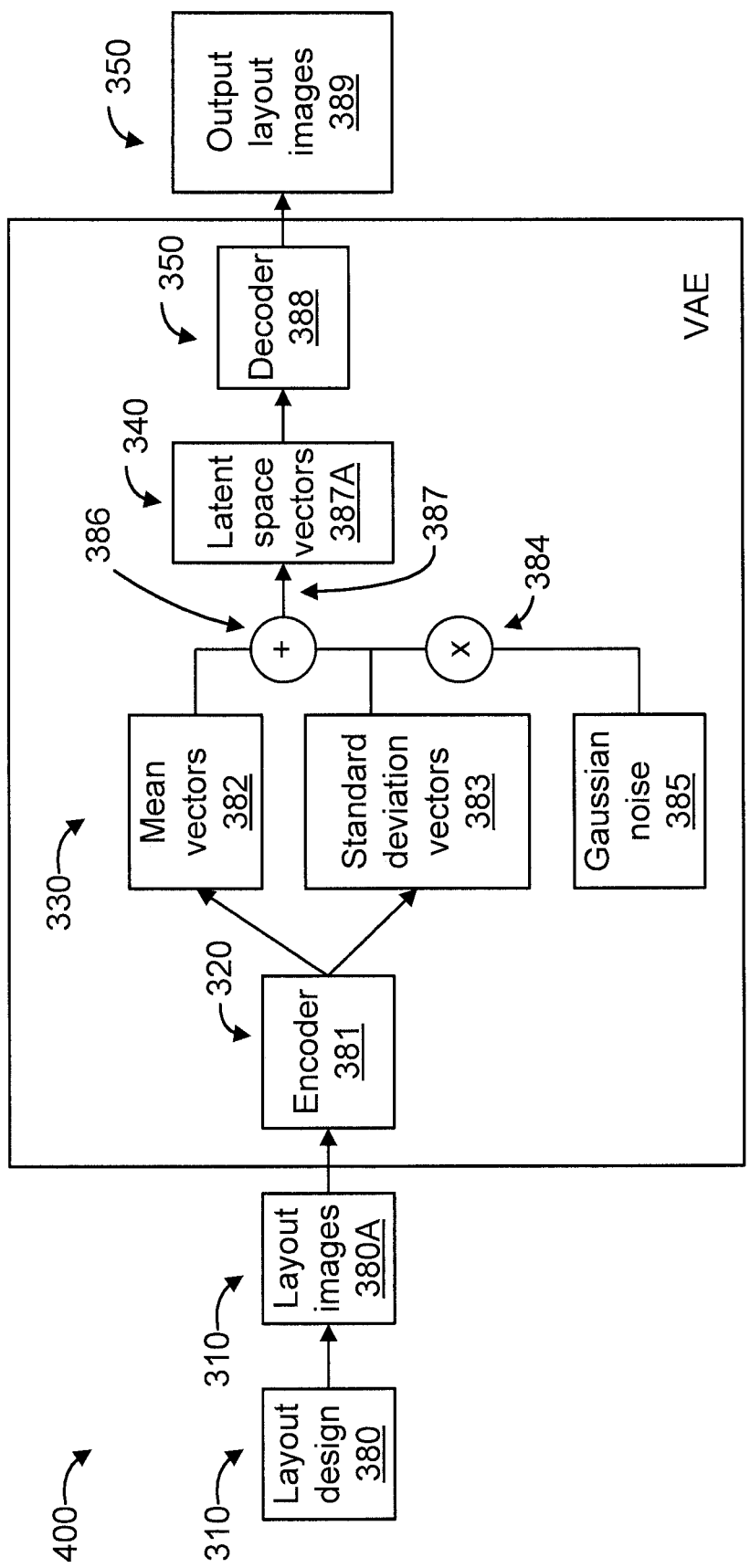
FIG. 4 is a block diagram showing the pipeline for the training workflow of FIG. 3, in accordance with an embodiment of the present invention.

FIG. 3 is a flow diagram showing an exemplary training workflow 300 for training a Feedforward Neural Network (FFNN)-based Variational Autoencoder (VAE) to automatically generate layout patterns, in accordance with an embodiment of the present invention. FIG. 4 is a block diagram showing the pipeline 400 for the training workflow 300 of FIG. 3, in accordance with an embodiment of the present invention.

At block 310, input a layout design 380 that can be turned by programming scripts into a set of layout images within a Field-of-View (FOV) of fixed size 380A. The images can be for layouts of vias, metal lines, and/or other circuit elements for training neural network models. In an embodiment, the layout design 380 can be in one or more layout formats such as, for example, but not limited to, Graphic Database System (GDS) and/or OASIS (a.k.a. OAS). In an embodiment, the set of layout images can be of actual (real) physical design layouts. In this way, the synthetic layouts generated by the present invention resemble actual (real) layouts.

In an embodiment, block 310 can include block 310A.

At block 310A, configure an automatic image capturing process to automatically capture the set of images 380A from the layout design 380 using programming scripts.

At block 320, encode (by an encoder 381 of the FFNN-based VAE 300) the set of layout images 380A to obtain mean vectors μ 382 and standard deviation vectors σ 383.

At block 330, randomly sample in the distribution represented by the mean vectors μ 382 and the standard deviation vectors σ 383. In an embodiment, block 330 can include multiplying (by a multiplier 384) the standard deviation vectors σ 383 by Gaussian noise 385 to obtain a product, and adding the product (by an adder 386) to the mean vectors μ 382 to obtain a set of latent space vector codings 387.

At block 340, decode (by a decoder 388 of the FFNN-based VAE 300) the vector codings 387 to reconstruct the layout images 380A as output images 389.

Figure 5:
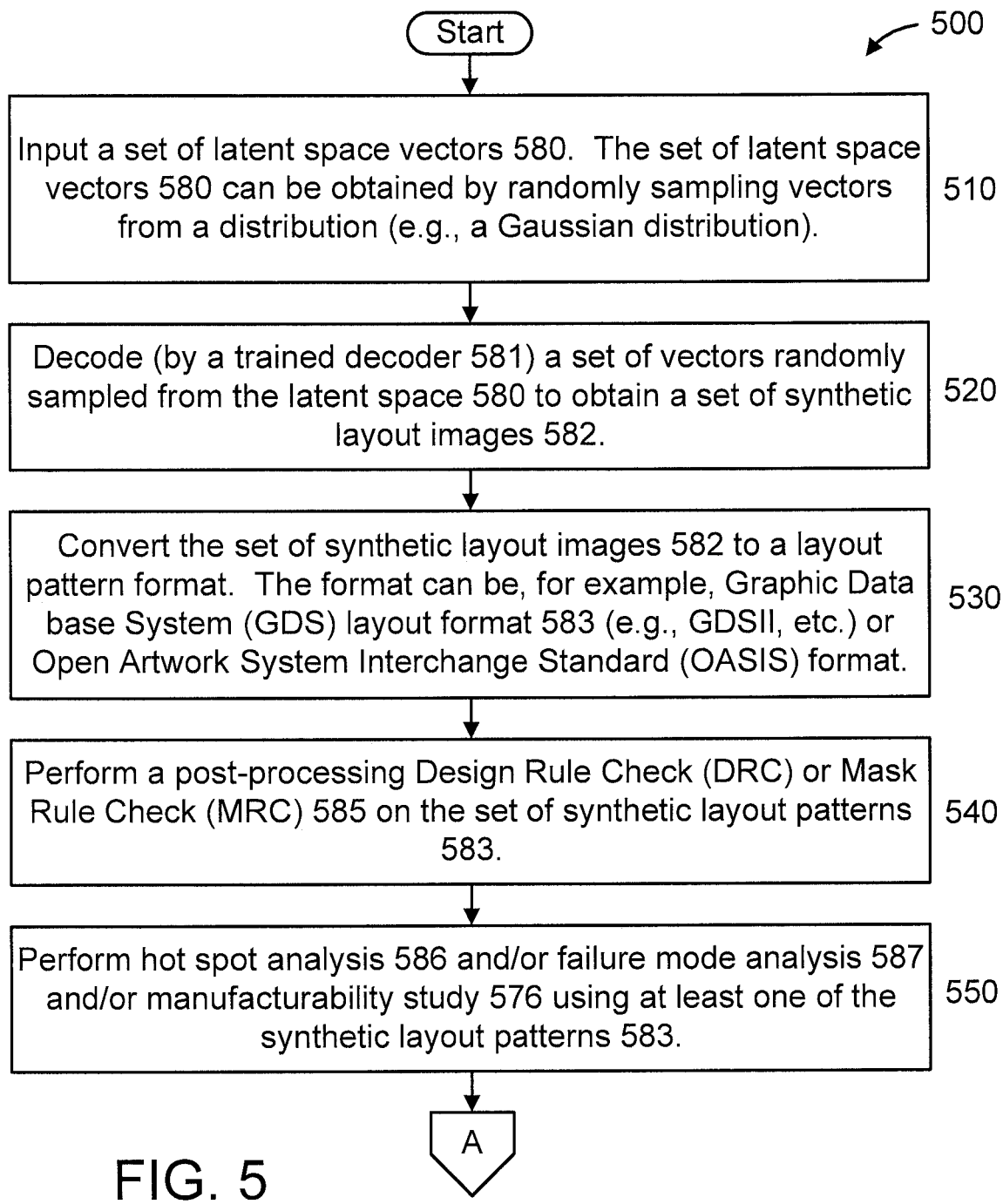
FIGS. 5-6 are flow diagrams showing an exemplary inference workflow for using a trained FFNN-based VAE to automatically generate layout patterns, in accordance with an embodiment of the present invention.
Figure 6:
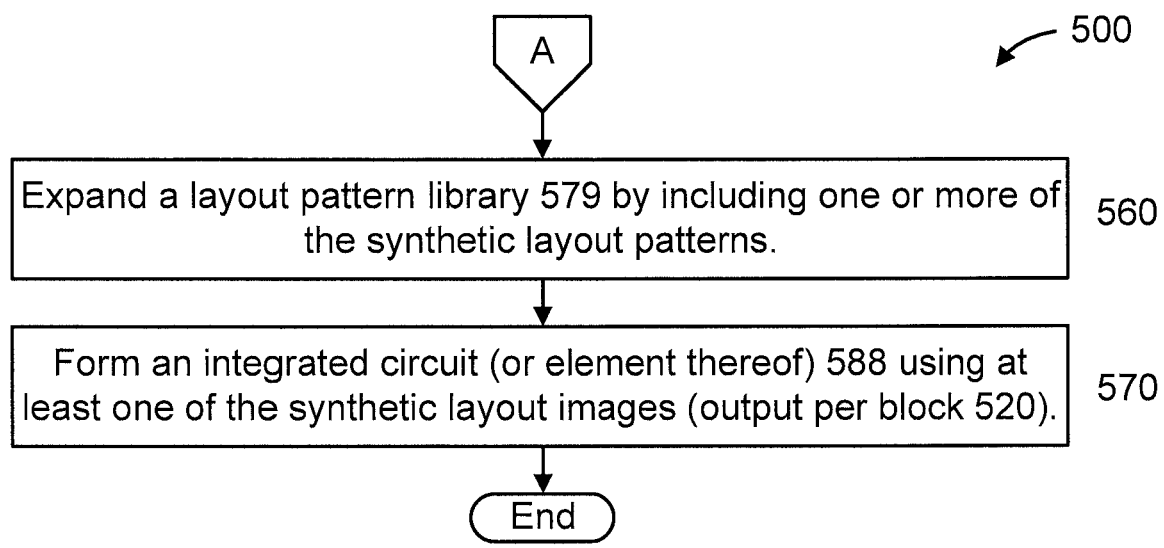
Figure 7:
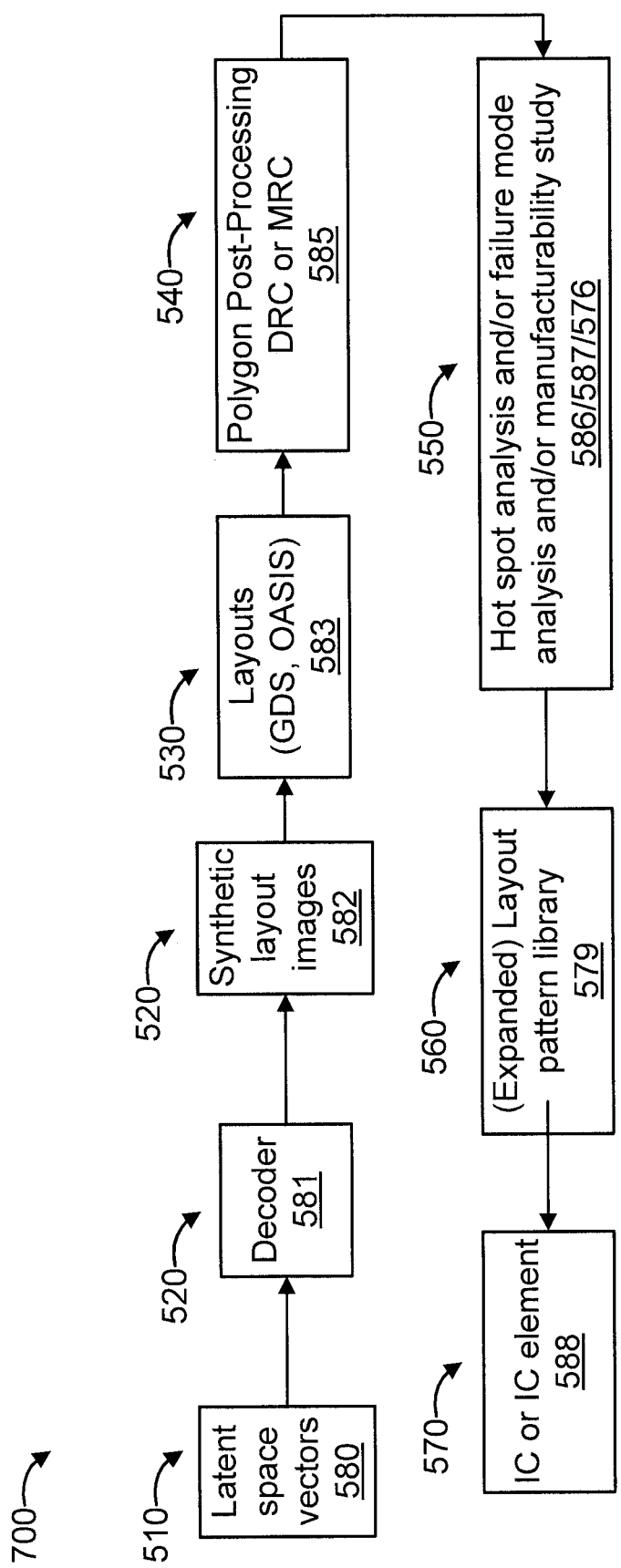
FIG. 7 is a block diagram showing the pipeline for the inference workflow of FIGS. 5-6, in accordance with an embodiment of the present invention.

FIGS. 5-6 are flow diagrams showing an exemplary inference workflow 500 for training a feedforward neural network (NN)-based Variational Autoencoder (VAE) to automatically generate layout patterns, in accordance with an embodiment of the present invention. FIG. 7 is a block diagram showing the pipeline 700 for the inference workflow 500 of FIGS. 5-6, in accordance with an embodiment of the present invention. It is to be appreciated that the inference workflow 500 and corresponding pipeline 700 use the FFNN-based VAE trained with respect to the training workflow 300 of FIG. 3 and corresponding pipeline 400 if FIG. 4.

At block 510, input a set of latent space vectors 580. In an embodiment, the set of latent space vectors 580 can be obtained by randomly sampling vectors from a distribution (e.g., a Gaussian distribution).

At block 520, decode (by a trained decoder 581) a set of vectors randomly sampled from the latent space 580 to obtain a set of synthetic layout images 582. These vectors are different than the vectors mentioned in the training workflow.

At block 530, convert the set of synthetic layout images 582 to a layout format. The format can be, for example, Graphic Data base System (GDS) layout pattern format 583 (e.g., GDSII, etc.) or Open Artwork System Interchange Standard (OASIS) format. In an embodiment, the conversion can involve image processing techniques and programming scripts to transform a synthetic layout image to a layout pattern in GDS or OASIS format. Of course, the present invention is not limited to the preceding conversion technique and, thus, other conversion techniques can also be used, while maintaining the spirit of the present invention. In another embodiment, the other format can be layouts 584.

At block 540, perform a post-processing Design Rule Check (DRC) or Mask Rule Check (MRC) 585 on the set of synthetic layout patterns 583. The DRC or MRC 585 can be used to remove and/or otherwise correct design or mask rule violating polygons and non-Manhattan shapes (i.e., shapes having edges not parallel to the x and y axes) in the final output layout patterns (per block 530).

At block 550, perform hot spot analysis 586 and/or failure mode analysis 587 and/or manufacturability study 576 by process simulation or wafer verification using at least one of the synthetic layout patterns.

At block 560, expand a layout pattern library 579 by including one or more of the synthetic layout patterns.

At block 570, form an Integrated Circuit (IC) (or element thereof) 588 using one or more of the synthetic layout patterns. Preferably, an expanded layout pattern from the layout pattern library is used to form the IC or element thereof.

In an embodiment, block such as at least blocks 540-570 can be considered as post-processing blocks.

Figure 8:
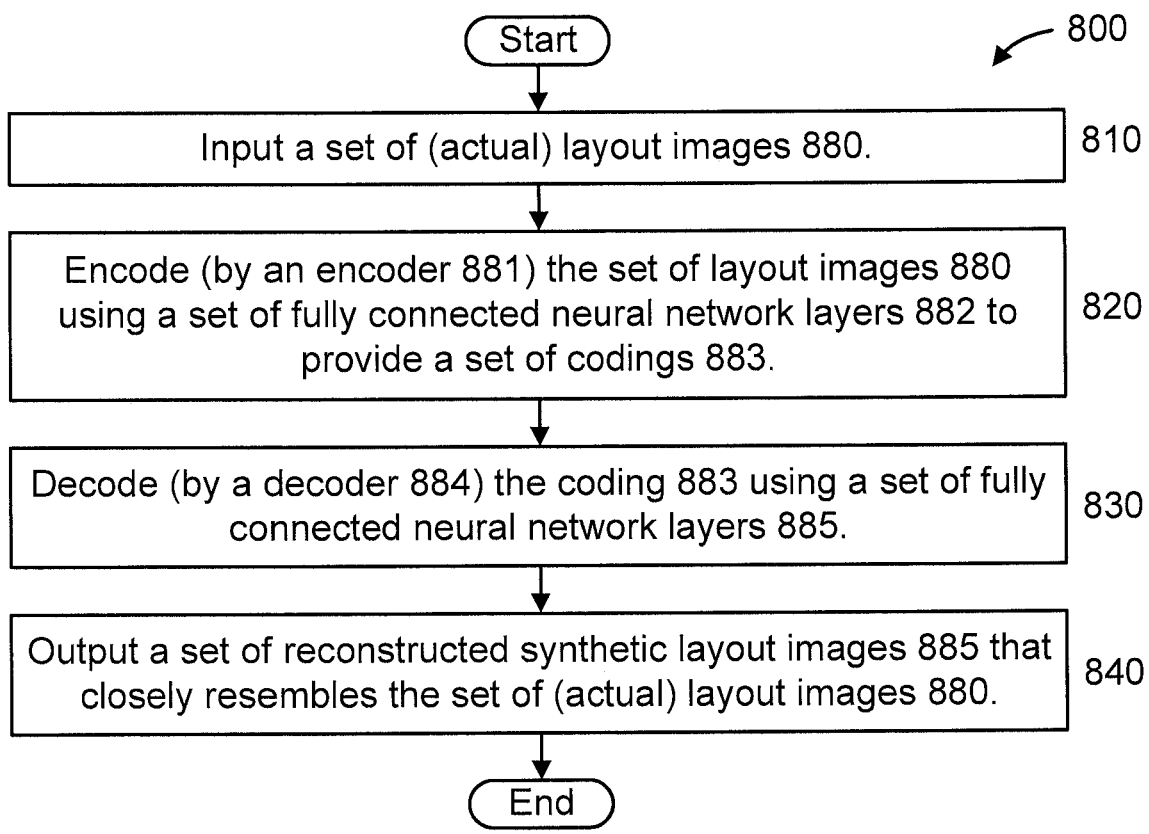
FIG. 8 is a flow diagram for a method for using an exemplary architecture of a fully connected neural network, which is one type of a Feedforward Neural Network (FFNN), as a Variational Autoencoder (VAE), in accordance with an embodiment of the present invention.
Figure 9:
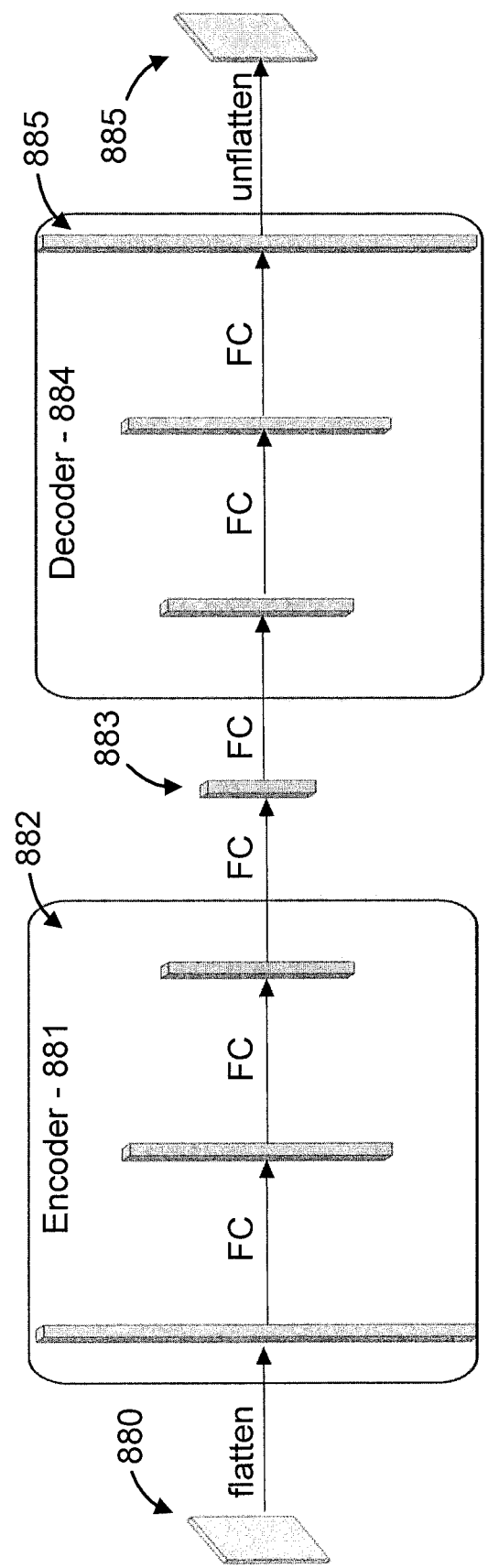
FIG. 9 is a block diagram showing the architecture on which the method of FIG. 8 is performed, in accordance with an embodiment of the present invention.

FIG. 8 is a flow diagram for a method 800 for using an exemplary architecture 900 of a fully connected neural network, which is one type of a Feedforward Neural Network (FFNN), as a Variational Autoencoder (VAE), in accordance with an embodiment of the present invention. FIG. 9 is a block diagram showing the architecture 900 on which the method 800 of FIG. 8 is performed, in accordance with an embodiment of the present invention.

At block 810, input a set of (actual) layout images 880.

At block 820, encode (by an encoder 881) the set of layout images 880 using a set of fully connected neural network layers 882 to provide a set of codings 883. The encoding operation first "flattens" the set of layout images 880. That is, each fully connected hidden layer 882 forming the encoder 881 dimensionally reduces the set of layout images 880 such that the codings 883 most efficiently and accurately represent the set of layout images 880 in the encoding process.

At block 830, decode (by a decoder 884) the coding 883 using a set of fully connected neural network layers 885. The decoding operation essentially "unflattens" the codings 883.

At block 840, output a set of reconstructed synthetic layout images 885 that closely resembles the set of (actual) layout images 880.

Figure 10:
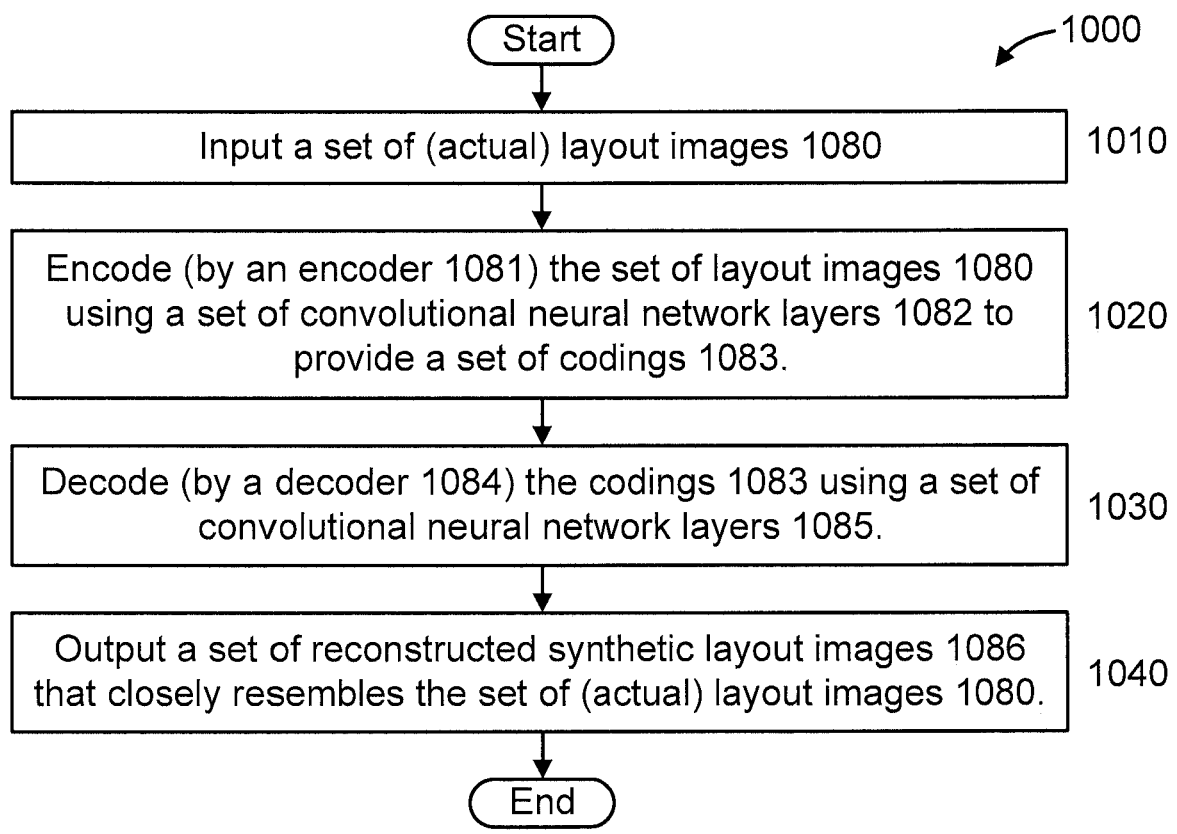
FIG. 10 is a flow diagram showing a method for using an exemplary architecture of a Convolutional Neural Network, which is another type of a Feedforward Neural Network (FFNN), as a Variational Autoencoder (VAE), in accordance with an embodiment of the present invention.
Figure 11:
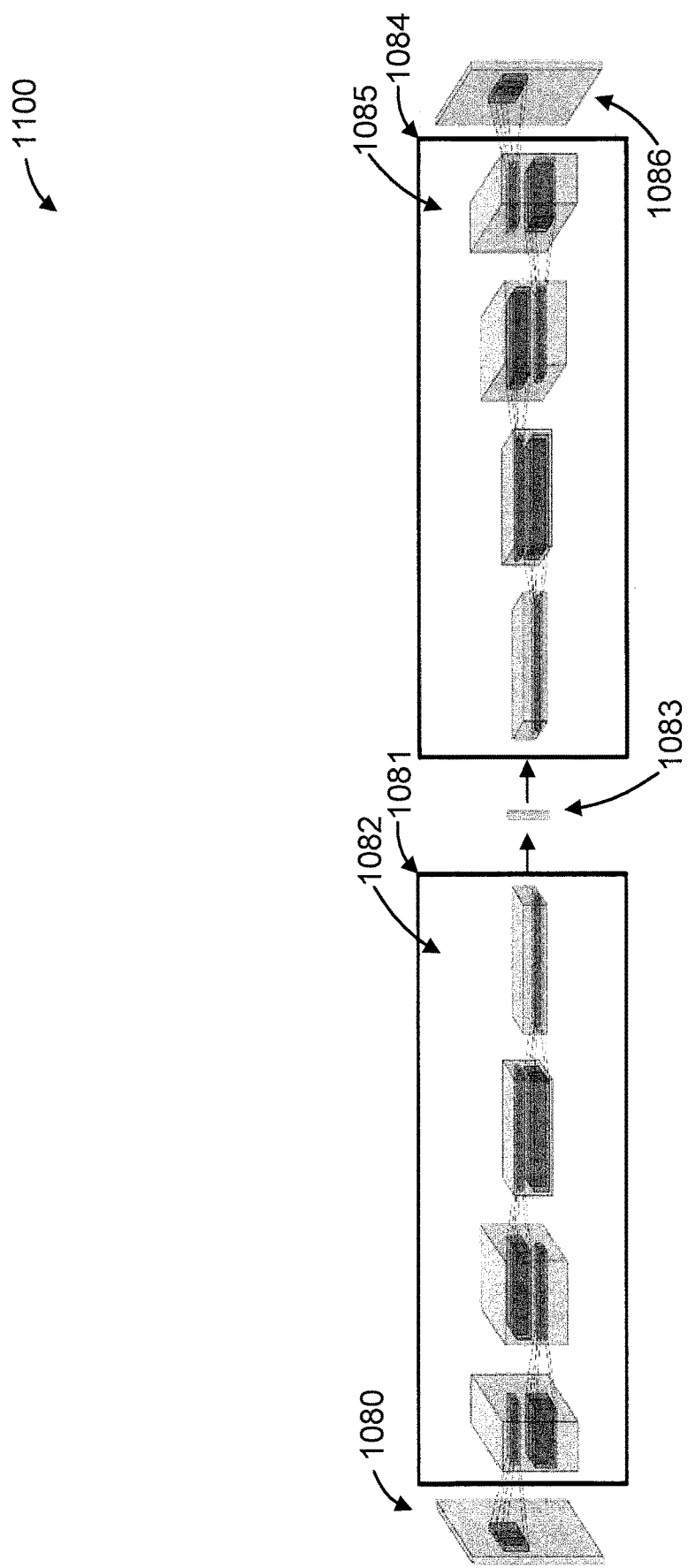
FIG. 11 is a block diagram showing the other architecture on which the method of FIG. 10 is performed, in accordance with an embodiment of the present invention.

FIG. 10 is a flow diagram showing a method 1000 for using an exemplary architecture of a Convolutional Neural Network, which is another type of a Feedforward Neural Network (FFNN), as a Variational Autoencoder (VAE), in accordance with an embodiment of the present invention FIG. 11 is a block diagram showing the architecture 1100 on which the method 1000 of FIG. 10 is performed, in accordance with an embodiment of the present invention.

At block 1010, input a set of (actual) layout images 1080.

At block 1020, encode (by an encoder 1081) the set of layout images 1080 using a set of convolutional neural network layers 1082 to provide a set of codings 1083. The set of layers 1082 can include, for example, convolutional layers (conv.), pooling layers, and normalization layers. The encoding operation essentially "flattens" the image 1080. That is, each layer 1082 forming the encoder 1081 dimensionally reduces the set of layout images 1080 such that the codings most efficiently and accurately represent the set of layout images 1080 in the encoding process.

At block 1030, decode (by a decoder 1084) the codings 1083 using a set of convolutional neural network layers 1085. The set of layers 1085 can include, for example, convolutional (conv.) layers, pooling layers, and normalization layers.

At block 1040, output a set of reconstructed synthetic layout images 1086 that closely resembles the set of (actual) layout images 1080.

It is to be appreciated that hyperparameters used for the feedforward NN-based VAE can vary case by case. Such hyperparameters can include, but are not limited to, the number of neural network layers, the number of neurons for each neural network layer, and so forth. Moreover, as noted above, the type of neural network used can vary. These and other variations that can be applied to the present invention are readily contemplated by one of ordinary skill in the art, given the teachings of the present invention provided herein, while maintaining the spirit of the present invention.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 12:
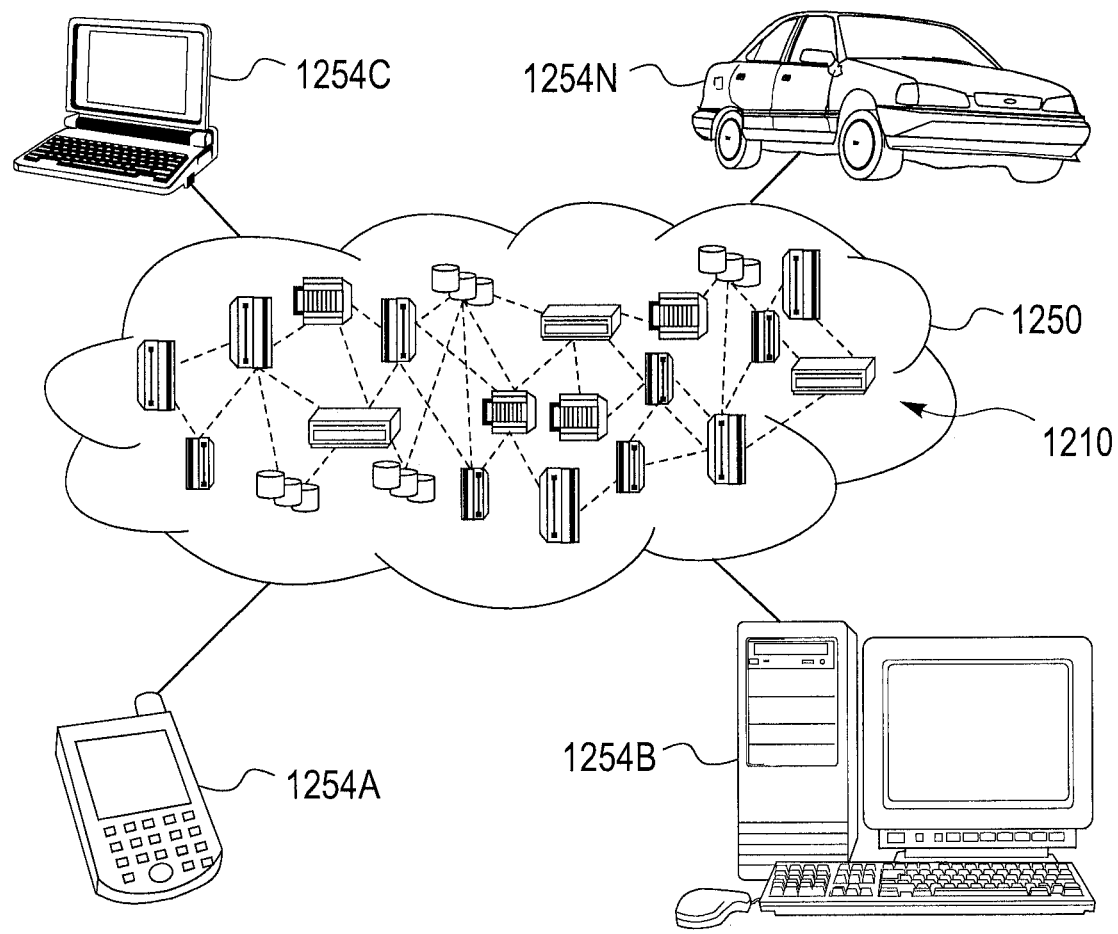
FIG. 12 is a block diagram showing an illustrative cloud computing environment having one or more cloud computing nodes with which local computing devices used by cloud consumers communicate in accordance with one embodiment.

Referring now to FIG. 12, illustrative cloud computing environment 1250 is depicted. As shown, cloud computing environment 1250 includes one or more cloud computing nodes 1210 with which local computing devices used by cloud consumers, such as, for example, personal digital assistant (PDA) or cellular telephone 1254A, desktop computer 1254B, laptop computer 1254C, and/or automobile computer system 1254N may communicate. Nodes 1210 may communicate with one another. They may be grouped (not shown) physically or virtually, in one or more networks, such as Private, Community, Public, or Hybrid clouds as described hereinabove, or a combination thereof. This allows cloud computing environment 1250 to offer infrastructure, platforms and/or software as services for which a cloud consumer does not need to maintain resources on a local computing device. It is understood that the types of computing devices 1254A-N shown in FIG. 12 are intended to be illustrative only and that computing nodes 1210 and cloud computing environment 1250 can communicate with any type of computerized device over any type of network and/or network addressable connection (e.g., using a web browser).

Figure 13:
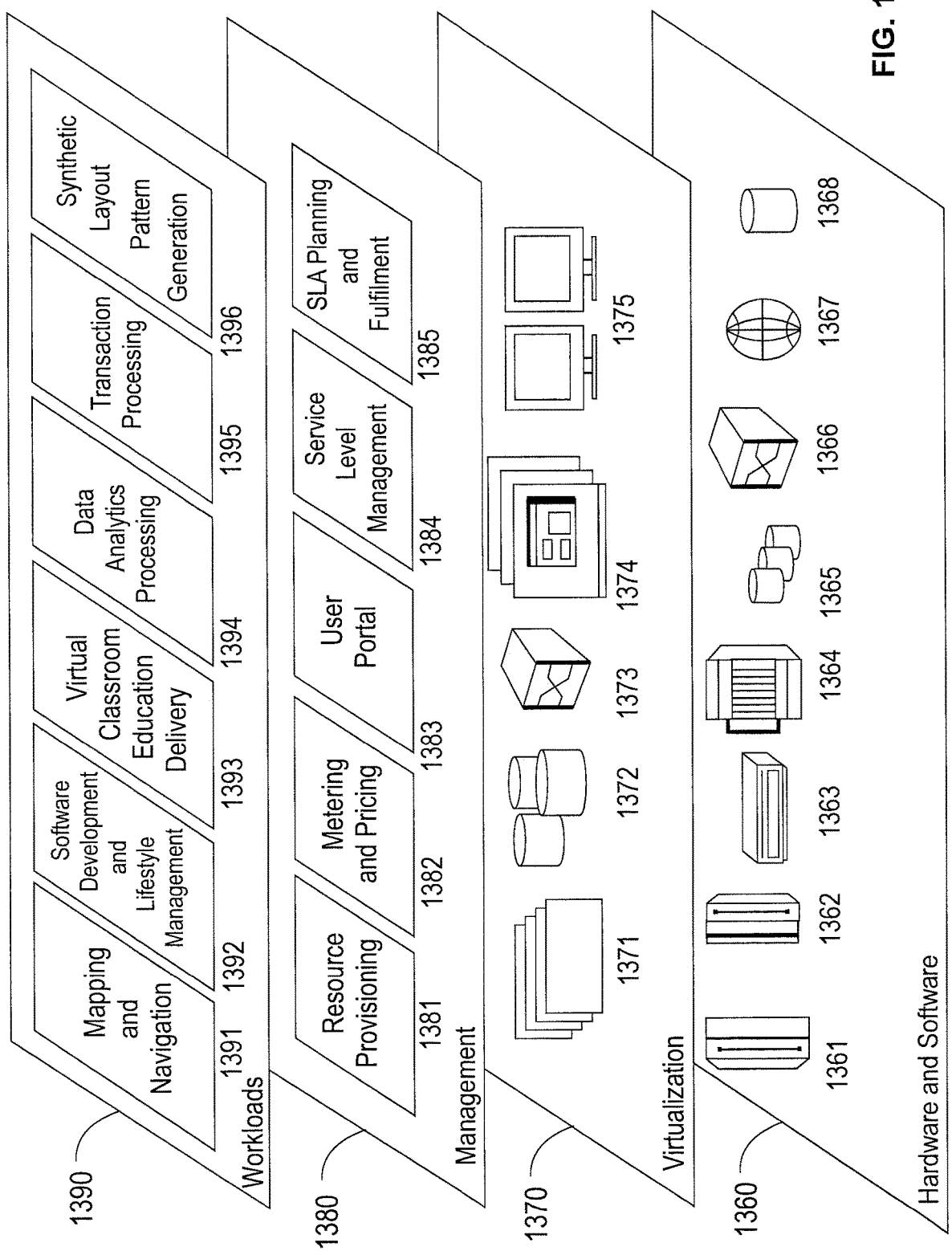
FIG. 13 is a block diagram showing a set of functional abstraction layers provided by a cloud computing environment in accordance with one embodiment.

Referring now to FIG. 13, a set of functional abstraction layers provided by cloud computing environment 1250 (FIG. 12) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 1360 includes hardware and software components. Examples of hardware components include: mainframes 1361; RISC (Reduced Instruction Set Computer) architecture based servers 1362; servers 1363; blade servers 1364; storage devices 1365; and networks and networking components 1366. In some embodiments, software components include network application server software 1367 and database software 1368.

Virtualization layer 1370 provides an abstraction layer from which the following examples of virtual entities may be provided: virtual servers 1371; virtual storage 1372; virtual networks 1373, including virtual private networks; virtual applications and operating systems 1374; and virtual clients 1375.

In one example, management layer 1380 may provide the functions described below. Resource provisioning 1381 provides dynamic procurement of computing resources and other resources that are utilized to perform tasks within the cloud computing environment. Metering and Pricing 1382 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1383 provides access to the cloud computing environment for consumers and system administrators. Service level management 1384 provides cloud computing resource allocation and management such that required service levels are met. Service Level Agreement (SLA) planning and fulfillment 1385 provide pre-arrangement for, and procurement of, cloud computing resources for which a future requirement is anticipated in accordance with an SLA.

Workloads layer 1390 provides examples of functionality for which the cloud computing environment may be utilized. Examples of workloads and functions which may be provided from this layer include: mapping and navigation 1391; software development and lifecycle management 1392; virtual classroom education delivery 1393; data analytics processing 1394; transaction processing 1395; and synthetic layout pattern generation by FFNN-based VAEs 1396.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer-implemented method for generating synthetic layout patterns, comprising:
   receiving, by a processor, a set of physical design layouts that include a variety of layout patterns for neural network training;
   generating, by the processor, a set of training layout pattern images for the neural network training by performing automatic image capturing on the set of physical design layouts with scripts;
   training, by the processor, a feedforward neural network (FFNN)-based Variational Autoencoder (VAE) with the set of training layout pattern images; and
   generating, by the processor using the FFNN-based VAE, new synthetic layout images.

2. The computer-implemented method of claim 1, wherein the synthetic layout patterns are synthetic single-layer layout patterns.

3. The computer-implemented method of claim 1, wherein the FFNN-based VAE is based on a fully-connected neural network.

4. The computer-implemented method of claim 1, wherein the FFNN-based VAE is based on a convolutional neural network.

5. The computer-implemented method of claim 1, wherein the new synthetic layout images are generated based on randomly sampled latent space vectors.

6. The computer-implemented method of claim 1, wherein said training step comprises randomly sampling a distribution represented by mean vectors and standard deviation vectors derived from the set of training layout pattern images.

7. The computer-implemented method of claim 6, wherein the distribution represented by the mean vectors and the standard deviation vectors is sampled based on a Gaussian noise distribution.

8. The computer-implemented method of claim 1, further comprising converting the new synthetic layout pattern from an image format to a layout format.

9. A computer program product for generating synthetic layout patterns, the computer program product comprising a non-transitory computer readable storage medium having program instructions embodied therewith, the program instructions executable by a computer to cause the computer to perform a method comprising:
   receiving, by a processor, a set of physical design layouts that include a variety of layout patterns for neural network training;
   generating, by the processor, a set of training layout pattern images for the neural network training by performing automatic image capturing on the set of physical design layouts with scripts;
   training, by the processor, a feedforward neural network (FFNN)-based Variational Autoencoder (VAE) with the set of training layout pattern images; and
   generating, by the processor using the FFNN-based VAE, new synthetic layout images.

10. The computer program product of claim 9, wherein the synthetic layout patterns are synthetic single-layer layout patterns.

11. The computer program product of claim 9, wherein the FFNN-based VAE is based on a set of fully-connected neural networks.

12. The computer program product of claim 9, wherein the FFNN-based VAE is based on a set of convolutional neural networks.

13. The computer program product of claim 9, wherein the new synthetic layout images are generated based on randomly sampled latent space vectors.

14. The computer program product of claim 9, wherein said training step comprises randomly sampling a distribution represented by mean vectors and standard deviation vectors derived from the set of training layout pattern images.

15. The computer program product of claim 14, wherein the distribution represented by the mean vectors and the standard deviation vectors is sampled based on a Gaussian noise distribution.

16. The computer program product of claim 9, wherein the method further comprises converting the new synthetic layout patterns from an image format to a layout format.

17. A computer processing system for generating synthetic layout patterns, comprising:
   a memory for storing program code; and
   a processor, operatively coupled to the memory, for running program code to
      receive a set of physical design layouts that include a variety of layout patterns for neural network training;
      generate a set of training layout pattern images for the neural network training by performing automatic image capturing on the set of physical design layouts with scripts;
      train a feedforward neural network (FFNN)-based Variational Autoencoder (VAE) with the set of training layout pattern images; and
      generate, using the FFNN-based VAE, new synthetic layout images.

18. The computer processing system of claim 17, wherein the new synthetic layout images are generated based on randomly sampled latent space vectors.

19. The computer processing system of claim 17, wherein the FFNN-based VAE is trained by randomly sampling a distribution represented by mean vectors and standard deviation vectors derived from the set of training layout pattern images.

20. The computer processing system of claim 19, wherein the distribution represented by the mean vectors and the standard deviation vectors is sampled based on a Gaussian noise distribution.

* * * * *